United States Patent [19]
Swart

[11] Patent Number: 5,729,146
[45] Date of Patent: Mar. 17, 1998

[54] QUICK STACKING TRANSLATOR FIXTURE

[75] Inventor: Mark A. Swart, Upland, Calif.

[73] Assignee: Everett Charles Technologies, Inc., Pomona, Calif.

[21] Appl. No.: 531,720

[22] Filed: Sep. 21, 1995

[51] Int. Cl.[6] ................................................. G01R 31/02
[52] U.S. Cl. ........................................ 324/754; 324/755
[58] Field of Search .................................. 324/754, 755, 324/761

[56] References Cited

U.S. PATENT DOCUMENTS

| 5,399,982 | 3/1995 | Driller et al. | 324/755 |
| 5,493,230 | 2/1996 | Swart et al. | 324/754 |

Primary Examiner—Ernest F. Karlsen
Assistant Examiner—Anh Phung
Attorney, Agent, or Firm—Christie, Parker & Hale, LLP

[57] ABSTRACT

A quick stacking translator fixture for a printed circuit board tester has a pattern of test probes on a base upon which the translator fixture is mounted. The translator fixture comprises a plurality of essentially parallel and vertically spaced apart rigid translator plates having selected patterns of aligned holes for positioning translator pins for contacting test points on a printed circuit board supported at one end of the translator fixture. The translator pins translate electrical test signals between the test points on the printed circuit board and the test probes on the base of the tester. The translator fixture includes a plurality of translator plate stacking towers of identical construction supporting the translator plates in their fixed positions in the translator fixture. Each stacking tower comprises a rigid support member formed as an integral piece having vertically spaced apart translator plate support surfaces with corresponding recessed upright alignment posts at spaced apart levels of the stacking tower. The translator plate support surfaces and their corresponding alignment posts having respective diameters at each level which are progressively shorter along the length of the tower to define a stair-step arrangement. The translator plates are assembled onto the stacking towers at predetermined levels in a progressive stacking sequence, so that each translator plate is supported by a corresponding translator plate support surface and retained thereon in a fixed position by engagement with the related alignment post.

14 Claims, 5 Drawing Sheets

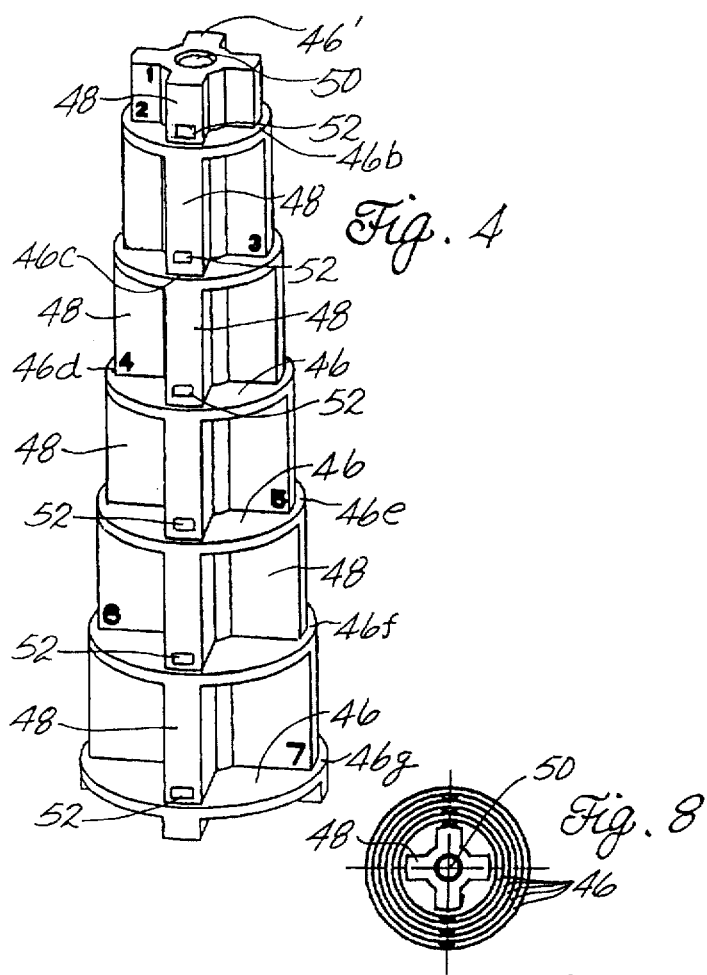
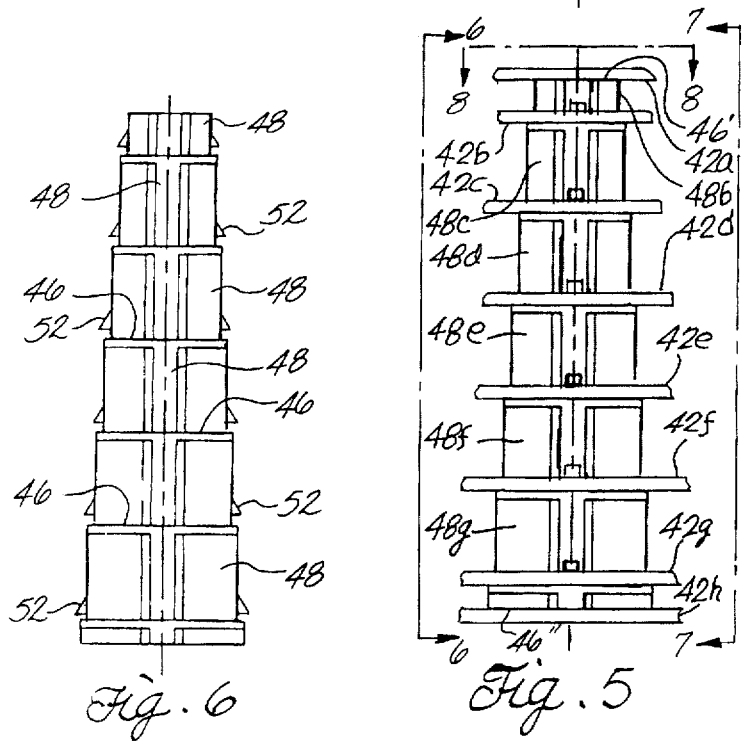
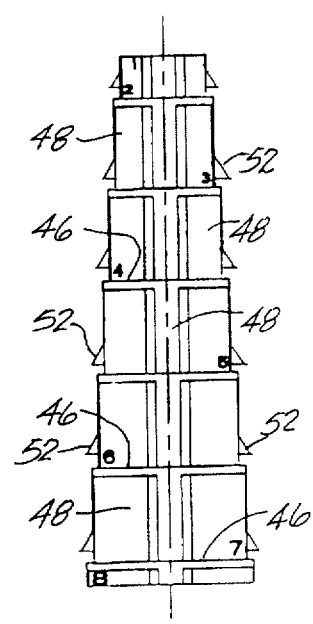

5,729,146

QUICK STACKING TRANSLATOR FIXTURE

FIELD OF THE INVENTION

This invention relates to the automatic testing of printed circuit boards, and more particularly, to a translator fixture for translating test signals from a board under test to a pattern of test probes in a tester. The invention has to do with improvements in the construction and assembly of the translator fixture.

BACKGROUND OF THE INVENTION

Automatic test equipment for checking printed circuit boards has long involved use of a "bed of nails" test fixture in which the circuit board is mounted during testing. This test fixture includes a large number of nail-like spring-loaded test probes arranged to make electrical contact under spring pressure with designated test points on the circuit board under test, also referred to as the unit under test or "UUT." Any particular circuit laid out on a printed circuit board is likely to be different from other circuits, and consequently, the bed of nails arrangement for contacting test points in the board must be customized for that particular circuit board. When the circuit to be tested is designed, a pattern of test points to be used in checking it is selected, and a corresponding array of test probes is configured in the test fixture. This typically involves drilling a pattern of holes in a probe plate to match the customized array of test probes and then mounting the test probes in the drilled holes on the probe plate. The circuit board is then mounted in the fixture superimposed on the array of test probes. During testing, the spring-loaded probes are brought into spring-pressure contact with the test points on the circuit board under test. Electrical test signals are then transferred from the board to the test probes and then to the exterior of the fixture for communication with a high speed electronic test analyzer which detects continuity or lack of continuity between various test points in the circuits on the board.

Various approaches have been used in the past for bringing the test probes and the circuit board under test into pressure contact for testing. One class of these fixtures is a "wired test fixture" in which the test probes are individually wired to separate interface contacts for use in transmitting test signals from the probes to the external electronically controlled test analyzer. These wired test fixtures are often referred to as "vacuum test fixtures" since a vacuum is applied to the interior of the test fixture housing during testing to compress the circuit board into contact with the test probes. Customized wired test fixtures of similar construction also can be made by using mechanical means other than vacuum to apply the spring force necessary for compressing the board into contact with the probes during testing.

The wire-wrapping or other connection of test probes, interface pins and transfer pins for use in a wired test fixture can be time intensive. However, customized wired test fixtures are particularly useful in testing circuit boards with complex arrangements of test points and low-volume production boards where larger and more complex and expensive electronic test analyzers are not practical.

As mentioned previously, the customized wired test fixtures are one class of fixtures for transmitting signals from the fixture to the external circuit tester. A further class of test fixtures is the so called "dedicated" test fixtures, also known as a "grid-type fixture," in which the random pattern of test points on the board are contacted by translator pins which transfer test signals to interface pins arranged in a grid pattern in a receiver. In these grid-type testers, fixturing is generally less complex and simpler than in the customized wired test fixtures.

A typical dedicated or grid fixture contains test electronics with a huge number of switches connecting test probes in a grid base to corresponding test circuits in the electronic test analyzer. In one embodiment of a grid tester as many as 40,000 switches are used. When testing a bare board on such a tester, a translator fixture supports translator pins that communicate between a grid pattern of test probes in a grid base and an off-grid pattern of test points on the board under test. In one prior art grid fixture so-called "tilt pins" are used as the translator pins. The tilt pins are straight solid pins mounted in corresponding pre-drilled holes in translator plates which are part of the translator fixture. The tilt pins can tilt in various orientations to translate separate test signals from the off-grid random pattern of test points on the board to the grid pattern of test probes in the grid base.

In the past, translator fixtures have been constructed and assembled with a plurality of translator plates made from a plastic material such as Lexan. The translator plates are stacked in the fixture between corresponding sets of spacers aligned with one another vertically to form "stand-offs" spaced apart around the periphery of the fixture. The spacers hold the translator plates in a fixed position spaced apart vertically from one another and reasonably parallel to each other. The translator plates at each level of the fixture have pre-drilled patterns of alignment holes that control the position of each tilt pin in the translator fixture.

Use of separate spacers at the different levels of the fixture can cause misalignments of the fixture components due to the ordinary manufacturing tolerances of the Lexan sheets and of the molded plastic spacers. A 0.060 inch Lexan sheet with its normal manufacturing tolerances can have a thickness in the range of about plus or minus 0.006 inch. The molded plastic spacers also can have manufacturing tolerances causing them to vary in thickness within a range of about plus or minus 0.003 inch. These variations in thickness can cause large stacking tolerances when the Lexan sheets and the molded plastic spacers are assembled into the finished translator fixture. The cumulative effect of these stacking tolerances can result in translator plates being aligned in slightly non-parallel relationships. Since the tilt pins extend diagonally through pre-drilled holes in the translator plates, the pins can bind during use of the translator plates if the translator plates are not in accurate parallel alignment. If the pre-drilled holes are made larger to compensate for misalignments of the translator plates, then pointing accuracy of the tilt pins suffers. In addition, assembling the fixture from separate sets of molded plastic spacers at each level slows down the assembly process and also can result in a given pre-drilled translator plate being inadvertently assembled into the fixture at the wrong level.

The present invention avoids stacking tolerances and their effects on misalignment of the fixture components caused by manufacturing tolerances in the translator plates and the separate spacers. The invention also improves the assembly process by preventing assembly of translator plate at the wrong level in the fixture and by reducing assembly time.

SUMMARY OF THE INVENTION

Briefly, one embodiment of this invention comprises a translator fixture for a printed circuit board tester of the type having a pattern of test probes on a base upon which the translator fixture is mounted. The translator fixture comprises a plurality of essentially parallel and vertically spaced apart rigid translator plates having selected patterns of pre-drilled holes for supporting translator pins for contacting test points on a printed circuit board supported on one side of the translator fixture. The translator pins translate electrical test signals between test points on the printed circuit board and the test probes at the base of the tester. The translator fixture includes a plurality of translator plate stacking towers of identical construction for supporting the translator plates in their fixed position in the translator fixture. Each stacking tower comprises a rigid support member formed as an integral piece having vertically spaced apart translator plate support surfaces with corresponding upright alignment posts at spaced apart levels of the stacking tower. The translator plate support surfaces and their corresponding alignment posts having respective diameters at each level which are progressively shorter along the length of the tower to define a stair-step arrangement. The different translator plates are assembled onto the stacking towers at predetermined levels in a progressive stacking sequence, so that each translator plate with its specific pattern of pre-drilled holes is supported by a corresponding translator plate support surface and retained thereon in a fixed position by engagement with the related alignment post.

The stacking towers cooperate to automatically align the translator plates at predetermined positions vertically within the fixture with extreme parallel accuracy which is independent of differences in the thickness of the translator plates caused by normal manufacturing tolerances. Since the stacking towers are identical and made from an integral piece having the supporting surfaces for the individual translator plates at pre-set levels on the tower, the parallel levels at which the translator plates are mounted are precisely controlled and are also independent of variations in spacer thickness characteristic of prior art fixtures. As a result, the fixture does not suffer from cumulative stacking tolerances caused by variations in translator plate and spacer thickness. The stacking towers also speed up the process of assembling the fixture, as well as avoiding any problem of assembling a given translator plate at the wrong level.

These and other aspects of the invention will be more fully understood by referring to the following detailed description and the accompanying drawings.

BRIEF DESCRIPTION OF THE DRAWINGS

FIG. 4 is a perspective view illustrating a stacking tower according to principles of this invention.

FIG. 5 is a side elevational view of a stacking tower according to principles of this invention.

FIG. 6 is a side elevational view taken on line 6—6 of FIG. 5.

FIG. 7 is a side elevational view taken on line 7—7 of FIG. 5.

FIG. 8 is a top plan view taken on line 8—8 of FIG. 5.

DETAILED DESCRIPTION

Figure 1:
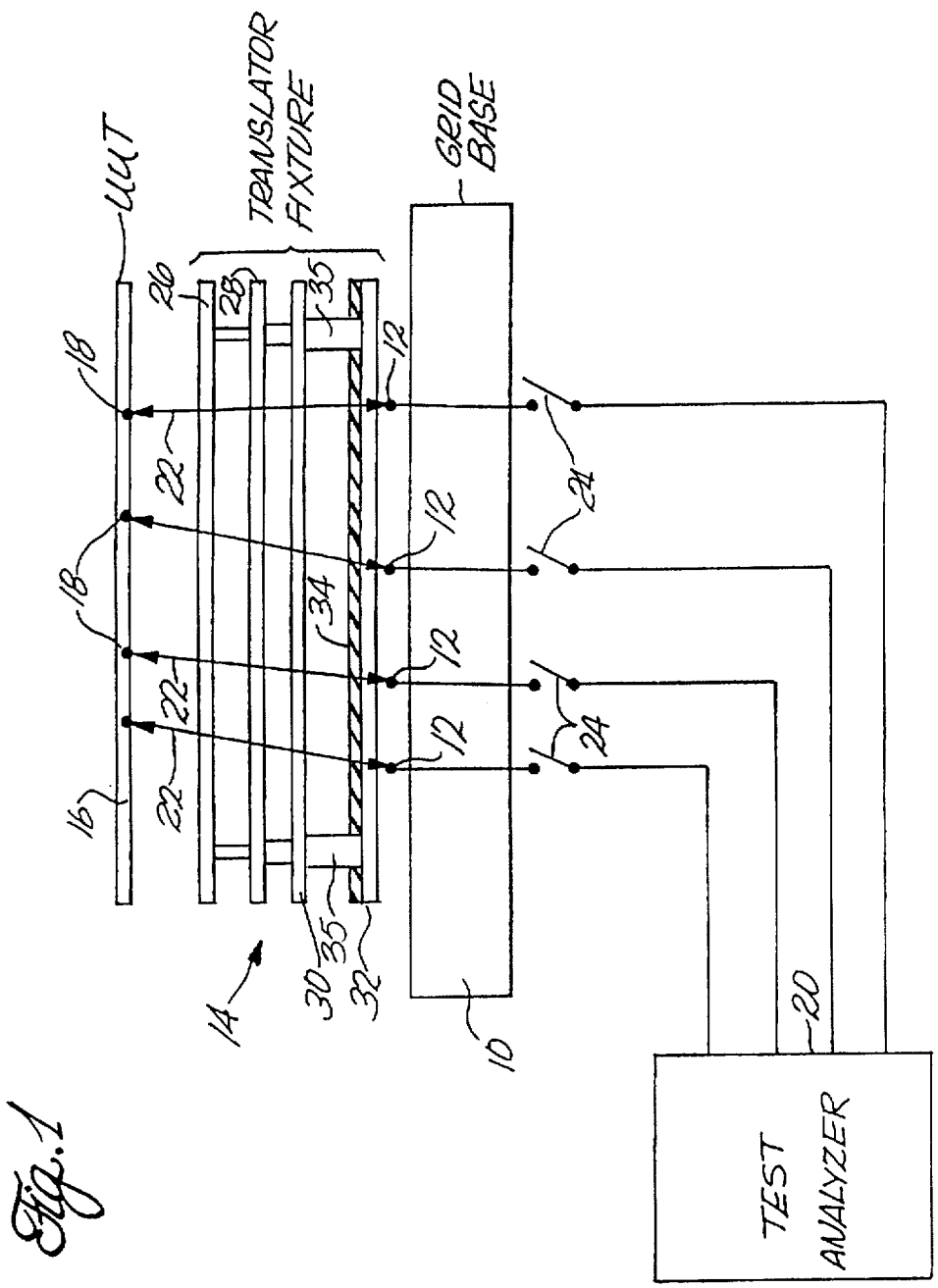
FIG. 1 is a schematic block diagram illustrating components of a dedicated or grid type tester and a translator fixture constructed and assembled according to principles of this invention.

Referring to the schematic block diagram of FIG. 1, a grid-type printed circuit board tester includes a grid base 10 having an array of spring-loaded test probes 12 arranged on a two-dimensional grid pattern. The test probes illustrated schematically in FIG. 1 preferably comprise an orthogonal array of uniformly spaced-apart rows and columns of test probes which may be aligned on 100 mil centers as an example. The spring-loaded plungers of the test probes 12 project above the surface of the grid base uniformly across the array of probes. A translator fixture 14 supports a printed circuit board 16 under test (also referred to as a "unit under test" or "UUT"). The translator fixture serves as an interface between an array of test points 18 on the board under test and the test probes 12 in the grid base 10. The translator fixture is the subject of this invention and is described in more detail below. An external electronic test analyzer 20 is electrically connected to the test points in the board under test through test probes in the translator fixture. These test probes (of which there can be several types) are illustrated generally at 22.

The test analyzer 20 contains electronic interrogation circuits to electronically interrogate separate test points 18 of the board under test in order to determine whether or not an electrical connection exists between any two given test points. The electrical connections detected between test points on the tested board are electronically compared with stored reference results obtained from a previous interrogation of test points of a faultless master printed circuit board. The tested board is good if test results match the stored reference results, but if any problem exists in the circuits on the board, the problem is detected by the test results and the bad boards then can be separated from the good boards.

Electronic interrogation circuits in one embodiment comprise the plurality of printed circuit cards (sometimes called "switch cards") having electronic components and printed circuits for carrying out the electronic testing. Each test probe used in the test procedure is represented as being coupled to the test electronics through a corresponding switch 24 leading to the test analyzer. In a given grid-type tester there can be as many as 40,000 switches available for testing the various test points in a board under test.

The translator fixture 14 includes a series of vertically spaced apart and parallel translator plates which may include a top plate 26, an upper plate 28 spaced a short distance below the top plate, a lower plate 30 at approximately an intermediate level of the translator fixture, and a base plate 32 at the bottom of the translator fixture. The translator plates are supported in parallel vertically spaced apart positions by rigid, integral stair-step posts 35 (also referred to as stacking towers) that hold the fixture together as a rigid unit. FIG. 1 illustrates use of four translator plates in the translator fixture; a larger number of translator plates are more commonly used and described in more detail below. The stacking towers 35 also are schematically illustrated in FIG. 1 and are illustrated in more detail in FIGS. 4 through 8.

The translator fixture also includes an array of standard translator pins such as tilt pins (represented schematically at 22) extending through the translator plates 26, 28, 30 and 32. FIG. 1 illustrates only a few of the standard tilt pins for simplicity. The tilt pins extending through the base plate 32 of the translator fixture are in alignment with the grid pattern of test probes 12 in the grid base 10. The top portions of the tilt pins, which extend through the top plate 26, are in an off-grid pattern aligned to match the random pattern of test points 18 on the UUT. Thus, the tilt pins can be tilted slightly in various three dimensional orientations used to translate between the grid pattern at the base and the off-grid pattern at the top. The standard tilt pins pass through holes in the base plate, through holes in the lower and upper plates, and through a hole pattern in the top plate. The holes in each of the translator plates (represented by reference numerals 33) are drilled in mostly diagonal patterns and the drill patterns are controlled by standard computer-operated software according to well-known procedures. The translator pins are retained in the fixture by an elastomeric pin retention sheet 34.

Figure 2:
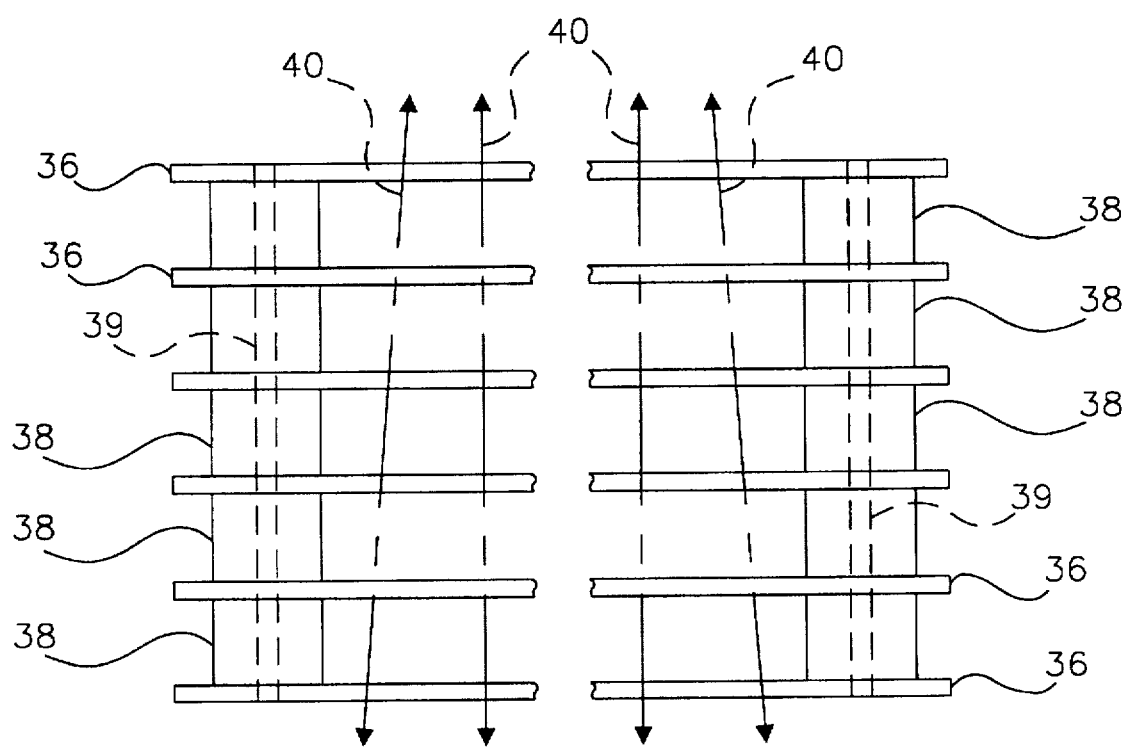
FIG. 2 is a fragmentary, semi-schematic side elevational view illustrating a prior art approach to constructing and assembling a translator fixture.

FIG. 2 schematically illustrates a typical translator fixture of the prior art in which vertically spaced apart translator plates 36 are supported in parallel alignment by a plurality of molded plastic spacers 38 that form stand-off posts for the plates. Separate sets of spacers are used at each level of the translator fixture to control the spacing between adjacent translator plates. Separate sets of the spacers also are aligned vertically around the periphery of the fixture. In the illustrated embodiment, a separate set of spacers is stacked vertically between translator plates to form each column-like stand-off post. The aligned spacers and the intervening translator plates are secured together by fasteners 39 which extend through aligned holes in the columns of individual spacers. Tilt pins 40 are shown schematically extending in various orientations through the translator plates.

Figure 3:
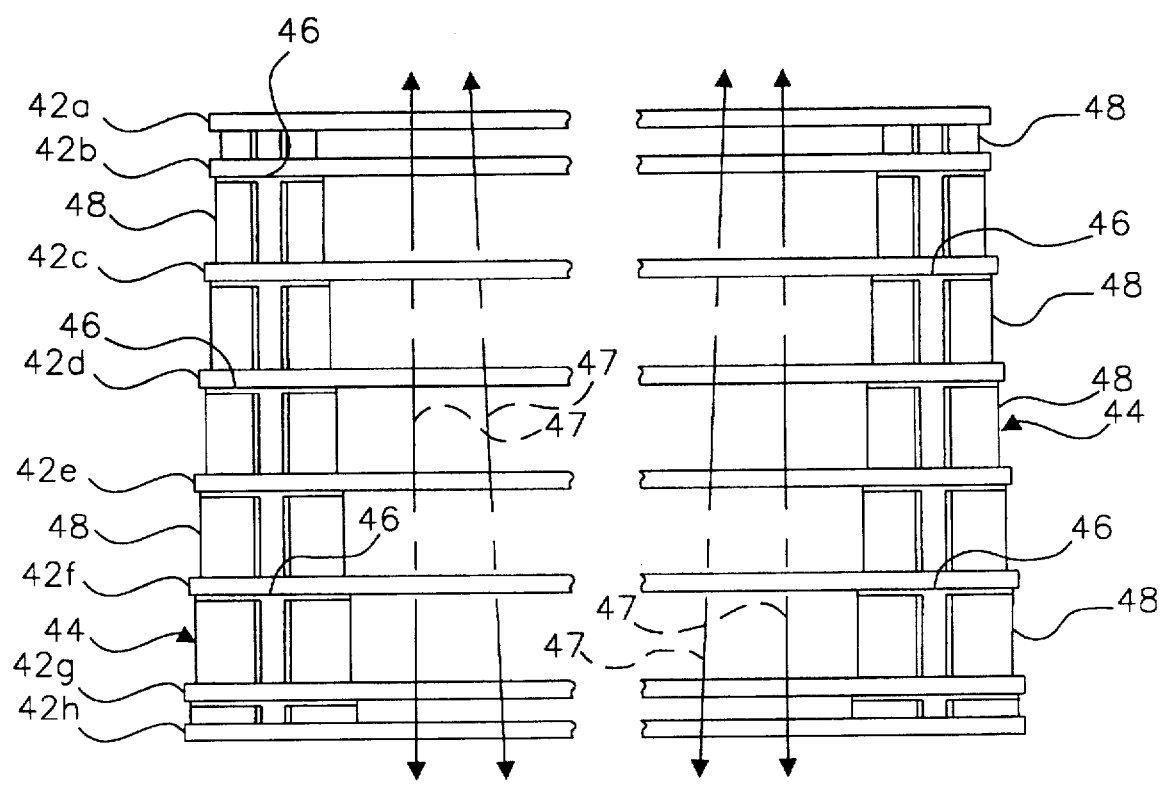
FIG. 3 is a fragmentary, semi-schematic side elevational view illustrating a translator fixture constructed and assembled according to principles of this invention.

FIG. 3 schematically illustrates a translator fixture according to principles of this invention in which translator plates 42 are mounted to separate stacking towers 44 of identical construction positioned around the periphery of the fixture. FIG. 3 illustrates one embodiment of a translator fixture having eight separate translator plates identified by reference numerals 42a through 42h. In this embodiment, ten stacking towers 44 support the translator plates in the fixture. The positions of the stacking towers are best illustrated with reference to FIG. 9 which shows a top plan view of a typical translator plate 42. Alignment holes 43 spaced apart around the periphery of the translator plate receive the stacking towers which are locked in place in the translator plate (as described below). This embodiment shows ten of the alignment holes 43 for positioning the corresponding group of ten stacking towers around the periphery of the translator plate.

Referring again to FIG. 3, each stacking tower 44 comprises a rigid support member formed as an integral piece having vertically spaced apart translator plate support surfaces 46 with corresponding upright alignment posts 48 at spaced apart levels of the stacking tower. The translator plate support surfaces 46 and their corresponding alignment posts 48 have respective diameters at each level which are progressively shorter along the length of the tower to define a stair-step arrangement. The translator plates are assembled onto each stacking tower at predetermined levels in a progressive stacking sequence so that each translator plate is supported by a corresponding unique translator support surface and is retained on that surface in a fixed position by engagement with the related alignment post which extends above the corresponding support surface. The pre-drilled alignment holes 43 (shown in FIG. 9) are adapted to match the outer surface configuration or diameter of the alignment post at the level at which the translator plate is stacked. This automatically positions the translator plates at predetermined levels in the fixture supported by the related translator plate mounting surfaces. Tilt pins 47 are schematically shown extending through the assembled set of translator plates.

FIGS. 4 through 8 best illustrate the stacking tower which comprises an integral molded plastic piece in which the vertically spaced apart mounting surfaces 46 are separated by intervening vertically spaced apart alignment posts 48. The mounting surfaces 46 are each circular in cross section and defined by a corresponding outside diameter at each level of the stacking tower. The outside diameters of the mounting surfaces are progressively wider in a direction progressing from top to bottom along the length of the tower. The intervening alignment posts 48 preferably have a cross-shaped cross-sectional configuration (best shown in FIGS. 4 and 8) and each cross is preferably aligned in an identical rotational position adjacent the other crosses so that the legs of all crosses extend in a the same radial directions above and below one another. This is best illustrated in the perspective view of FIG. 4. Each of the legs of the cross-shaped posts are the same length at each level of the tower, and preferably, each cross-shaped post 48 has an outside diameter slightly less than the outside diameter of the corresponding translator plate mounting surface 46 below it. This forms stair-step bearing surfaces described below. The posts and the mounting surfaces are centered on a long central bore 50 extending through the tower from top to bottom and which is open at both ends. The outer surfaces of legs of the crosses on opposite sides of each tower have corresponding outwardly-projecting tapered shoulders 52 each of which is spaced above a corresponding bearing surface below it by a distance equal to the thickness of the corresponding translator plate mounted to the bearing surface. The shoulders are used to lock each translator plate in place in a fixed position on the corresponding bearing surface 46 below it.

In use, the translator plates are stacked over the top of each stacking tower in a predetermined sequence. Each translator plate has a corresponding unique pattern of pre-drilled holes 49 (see FIG. 9) for retaining the tilt pins 47 at a given level of the translator fixture. Each translator plate also has an identical set of pre-drilled alignment holes 43 (see FIG. 9) of unique diameter for each level that matches the outside diameter of a corresponding alignment post at the same level of the stacking tower. FIG. 5 best illustrates the translator plates 42a through 42h mounted on a given stacking tower. The top translator plate 42a is mounted on a bearing surface 46' defined by the cross-shaped surface at the upper end of the stacking tower. Similarly, the bottom translator plate 42h is mounted on a bearing surface 46" defined by the cross-shaped surface at the bottom of the stacking tower. The translator plates 42b through 42g are mounted on corresponding translator plate mounting surfaces 46b through 46g, respectively. As best shown in FIG. 4, each mounting surface 46b through 46g is provided by a narrow annular bearing surface of circular configuration extending around the outer periphery of each mounting surface 46. The corresponding translator plate in the stack has a corresponding alignment hole 43 with a diameter that matches the outside diameter of the corresponding alignment posts, so that each translator plate rests on a unique bearing surface and is engaged by a corresponding alignment post above it of equal diameter to hold the translator plate in a fixed position at a unique level on the stacking tower. The alignment posts shown in FIG. 5 are identified by reference numerals 48b through 48g to correspond to the translator plates 42b through 42g that engage the related posts. The narrow annular bearing surfaces 46b–46g define the stair-step configuration of parallel support surfaces extending progressively along the length of the stacking tower.

Figure 9:
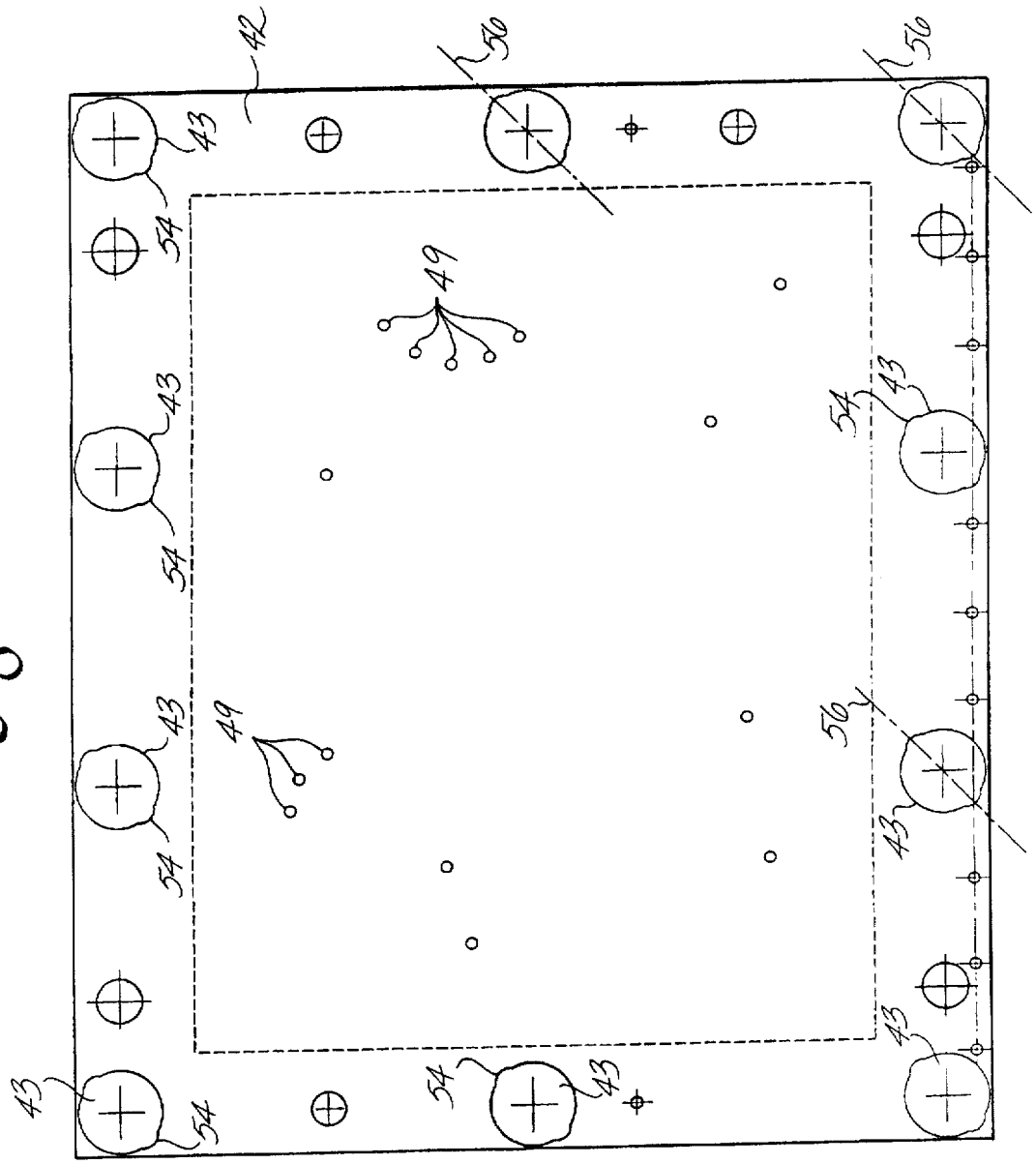
FIG. 9 is an elevational view showing a hole pattern formed in a translator plate used in combination with the stacking tower.

Referring to FIG. 9, each alignment hole 43 in the translator plate 42 has corresponding diametrically opposed key slots 54 that protrude outwardly from the hole. The key slots are aligned on a diagonal axis which is askew from the parallel edges of the rectangular translator plate. The key slots are all aligned on corresponding parallel and diagonal axes 56. In the stacking sequence the translator plate is aligned with the stacking tower so that the shoulders 52 that protrude from the opposite sides of the stacking tower can fit through the corresponding key slots 54 of the particular translator plate being assembled at each level. When all translator plates in the stack are in place, the stacking towers are then rotated to an angular position that causes the plates to pass under the shoulders so that the shoulders all cooperate to hold the translator plates in position to provide a vertical restraint at each level.

FIG. 9 also shows tooling pin holes 58 for alignment of a lower translator plate with tooling pins on the fixture grid base. Tooling pin holes 60 also are used for securing the translator fixture to an upper or lower probe plate of the test unit.

In the process of assembling the translator fixture the individual translator plates are pre-drilled with the tilt pin alignment holes 49 on a corresponding pattern for each level of the stacking tower. The alignment holes 43 are also pre-drilled for each translator plate to match the size of the alignment posts for that given level. The translator plates are then positioned over the stacking towers and dropped down on the stacking towers in a progressive sequence starting from the bottom and progressing upwardly until all translator plates engage and rest on corresponding bearing surfaces at the different levels. The translator plates bypass the shoulders 52 by first rotating the stacking towers to a position that aligns the shoulders with the key slots 54 of the alignment holes. The translator plates are then locked in place after the stacking sequence by rotating the stacking towers so the translator plates fit under the shoulders 52. The top and bottom translator plates are added to the stack along with a fastener extending through the central bore 50 for rigidly securing all translator plates in place.

The invention avoids stacking tolerances and their cumulative effects on misalignment of the fixture components caused by manufacturing tolerances in the translator plates and the separate spacers. Each translator plate regardless of its thickness is mounted at a specific level in the translator fixture defined by the level of its corresponding mounting surface on the stacking tower. The tolerance effects of manufacturing tolerances produced by the prior art use of separate spacers also is avoided because the bearing surfaces of the stacking tower all are positioned at identical levels, and therefore, the translator plates are positioned at corresponding identical levels in the fixture. Assembly time also is reduced by the sequential stacking sequence.

What is claimed is:

1. For use in a translator fixture for a printed circuit board tester of the type having a pattern of test probes on a base upon which the translator fixture is mounted, the translator fixture comprising a plurality of essentially parallel and vertically spaced apart rigid translator plates supported in a fixed position in the translator fixture and having selected patterns of holes aligned in the translator plates for containing and supporting translator pins extending through the translator plates for positioning the translator pins for contacting test points on a printed circuit board supported in an essentially horizontally position at one end of the translator fixture, the pins translating electrical test signals between the test points on the printed circuit board and the test probes on the base of the tester, the improvement in which the translator fixture includes a plurality of translator plate stacking towers of identical construction for supporting the translator plates in their fixed position in the translator fixture, each stacking tower comprising a rigid unitary support member formed as an integral piece and having a plurality of vertically spaced apart translator plate support surfaces with corresponding upright alignment posts at spaced apart levels of the stacking tower, the translator plate support surfaces and their corresponding alignment posts having respective diameters at each level which are progressively shorter along the length of the tower to define a stair-step arrangement in which translator plates can be assembled onto the stacking towers at predetermined levels in a progressive stacking sequence so that each translator plate is supported by a corresponding translator plate support surface and retained thereon in a fixed position by engagement with the related alignment post.

2. Apparatus according to claim 1 in which each translator plate has a plurality of alignment holes of predetermined size matching an outside diameter of the alignment posts associated with a corresponding level of the translator fixture.

3. Apparatus according to claim 2 in which the alignment posts have projecting shoulders spaced above corresponding support surfaces for locking the translator plates to each support surface.

4. Apparatus according to claim 3 in which the alignment holes have key slot portions adapted to bypass the shoulders on the alignment post in a stacking sequence.

5. A translator fixture for a printed circuit board tester of the type having a pattern of test probes on a base upon which the translator fixture is mounted, the translator fixture comprising a plurality of essentially parallel and vertically spaced apart rigid translator plates supported in a fixed position in the translator fixture and having selected patterns of holes aligned in the translator plates for containing and supporting translator pins extending through the translator plates for positioning the translator pins for contacting test points on a printed circuit board supported in an essentially horizontally position at one end of the translator fixture, the pins translating electrical test signals between the test points on the printed circuit board and the test probes on the base of the tester, the translator fixture including a plurality of translator plate stacking towers of identical construction for supporting the translator plates in their fixed position in the translator fixture, each stacking tower comprising a rigid unitary support member formed as an integral piece and having a plurality of vertically spaced apart translator plate support surfaces with corresponding upright alignment posts at spaced apart levels of the stacking tower, the translator plate support surfaces and their corresponding alignment posts having a unique size at each level of the stacking tower which is progressively smaller along the length of the tower, each translator plate having corresponding mounting holes engaging a corresponding alignment post to retain the translator plate in a fixed position supported on the support surface associated with the alignment post, each translator plate having mounting holes of a predetermined size that correspond to a unique level at which the translator plate is positioned on the stacking tower in accordance with the size associated with the support surface and its related alignment post.

6. Apparatus according to claim 5 in which each translator plate has a plurality of alignment holes of predetermined size matching an outside diameter of the alignment posts associated with a corresponding level of the translator fixture.

7. Apparatus according to claim 6 in which the alignment posts have projecting shoulders spaced above corresponding support surfaces for locking the translator plates to each support surface.

8. Apparatus according to claim 7 in which the alignment holes have key slot portions adapted to bypass the shoulders on the alignment post in a stacking sequence.

9. For use in a translator fixture for a printed circuit board tester of the type having a pattern of test probes on a base upon which the translator fixture is mounted, the translator fixture comprising a plurality of essentially parallel and vertically spaced apart rigid translator plates supported in a fixed position in the translator fixture and having selected patterns of holes aligned in the translator plates for containing and supporting translator pins extending through the translator plates for positioning the translator pins for contacting test points on a printed circuit board supported in an essentially horizontally position at one end of the translator fixture, the pins translating electrical test signals between the test points on the printed circuit board and the test probes on the base of the tester, the improvement in which the translator fixture includes a plurality of translator plate stacking towers of identical construction for supporting the translator plates in their fixed position in the translator fixture, each stacking tower comprising a rigid support member formed as an integral piece having vertically spaced apart translator plate support surfaces with corresponding upright alignment posts at spaced apart levels of the stacking tower, the translator plate support surfaces and their corresponding alignment posts having respective diameters at each level which are progressively shorter along the length of the tower to define a stair-step arrangement in which translator plates can be assembled onto the stacking towers at predetermined levels in a progressive stacking sequence so that each translator plate is supported by a corresponding translator plate support surface and retained thereon in a fixed position by engagement with the related alignment post.

10. Apparatus according to claim 9 in which the alignment posts have projecting shoulders spaced above corresponding support surfaces for locking the translator plates to each support surface.

11. Apparatus according to claim 10 in which the alignment holes have key slot portions adapted to bypass the shoulders on the alignment post in a stacking sequence.

12. A translator fixture for a printed circuit board tester of the type having a pattern of test probes on a base upon which the translator fixture is mounted, the translator fixture comprising a plurality of essentially parallel and vertically spaced apart rigid translator plates supported in a fixed position in the translator fixture and having selected patterns of holes aligned in the translator plates for containing and supporting translator pins extending through the translator plates for positioning the translator pins for contacting test points on a printed circuit board supported in an essentially horizontally position at one end of the translator fixture, the pins translating electrical test signals between the test points on the printed circuit board and the test probes on the base of the tester, the translator fixture including a plurality of translator plate stacking towers of identical construction for supporting the translator plates in their fixed position in the translator fixture, each stacking tower comprising a rigid support member formed as an integral piece having vertically spaced apart translator plate support surfaces with corresponding upright alignment posts at spaced apart levels of the stacking tower, the translator plate support surfaces and their corresponding alignment posts having a unique size at each level of the stacking tower which is progressively smaller along the length of the tower, each translator plate having corresponding mounting holes engaging a corresponding alignment post to retain the translator plate in a fixed position supported on the support surface associated with the alignment post, each translator plate having mounting holes of a predetermined size that correspond to a unique level at which the translator plate is positioned on the stacking tower in accordance with the size associated with the support surface and its related alignment post.

13. Apparatus according to claim 12 in which the alignment posts have projecting shoulders spaced above corresponding support surfaces for locking the translator plates to each support surface.

14. Apparatus according to claim 13 in which the alignment holes have key slot portions adapted to bypass the shoulders on the alignment post in a stacking sequence.

* * * * *